United States Patent [19]

Osawa et al.

[11] Patent Number: 5,905,737
[45] Date of Patent: *May 18, 1999

[54] TEST CIRCUIT

[75] Inventors: Tokuya Osawa; Hideshi Maeno, both of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/788,838

[22] Filed: Jan. 27, 1997

[30] Foreign Application Priority Data

Sep. 3, 1996 [JP] Japan .................................. 8-232845

[51] Int. Cl.$^6$ .................................................. G01R 21/28
[52] U.S. Cl. ........................................ 371/22.31; 365/201
[58] Field of Search ............................ 371/22.31, 22.32, 371/22.33, 22.34, 22.5, 26, 22.4, 27.5, 21.1; 364/489, 490; 324/73.1; 395/183.06, 183.18; 365/201, 189.12

[56] References Cited

U.S. PATENT DOCUMENTS

| 4,503,537 | 3/1985 | McAnney ................................. 371/25 |
| 5,155,432 | 10/1992 | Mahoney ............................ 324/158 R |
| 5,257,267 | 10/1993 | Ishizaka ................................ 371/22.3 |
| 5,260,949 | 11/1993 | Hashizume et al. ................... 371/22.3 |
| 5,428,622 | 6/1995 | Kuban et al. .......................... 371/22.3 |
| 5,448,575 | 9/1995 | Hashizume ............................ 371/22.3 |
| 5,459,736 | 10/1995 | Nakamura ............................. 371/22.3 |
| 5,471,481 | 11/1995 | Okumoto et al. ...................... 371/22.3 |
| 5,592,493 | 1/1997 | Cruoch et al. ......................... 371/22.3 |
| 5,631,911 | 5/1997 | Whetsel, Jr. ........................... 371/22.3 |

FOREIGN PATENT DOCUMENTS

| 1-110274 | 4/1989 | Japan . |
| 6-90265 | 11/1994 | Japan . |
| 7-122653 | 12/1995 | Japan . |
| 8-5711 | 1/1996 | Japan . |
| 8-94718 | 4/1996 | Japan . |

Primary Examiner—Robert W. Beausoliel, Jr.
Assistant Examiner—Nadeem Iqbal
Attorney, Agent, or Firm—Burns, Doane, Swecker & Mathis, L.L.P

[57] ABSTRACT

In a normal mode, a logic test signal (LOGTEST), a RAM test signal (RAMTEST), and a shift mode signal (SM) are set to "0". A RAM core (91) is synchronously written and asynchronously read. In a logic test mode, the RAM test signal (RAMTEST) is set to "0", and the logic test signal (LOGTEST) is set to "1". In a RAM test mode, the RAM test signal (RAMTEST) is set to "1", and the logic test signal (LOGTEST) is set to "0". A scan path (3a) is used both as a scan path provided between logic portions (82, 83) in the logic test and as a scan path provided at the output of the RAM core (91) in the RAM test. The scan path provides a high area utilization efficiency.

11 Claims, 17 Drawing Sheets

TEST CIRCUIT

BACKGROUND OF THE INVENTION

1. Field of the Invention

The present invention relates to a scan path and, more particularly, to a scan path provided on the periphery of an asynchronous RAM core and a logic circuit.

2. Description of the Background Art

FIG. 16 is a block diagram of a structure for performing a test technique using a scan test method wherein scan paths 1 to 3 are provided for a logic region 80 including three logic portions 81 to 83 and an asynchronous RAM core 91 surrounded by the logic region 80. In the scan test method, flip-flops (FFs) within a chip are replaced with scan flip-flops (SFFs) to form a scan path.

With reference to FIG. 16, for example, a serial scan-in signal SI1 which is test data is sequentially applied to the scan paths 1 to 3, and a test result is outputted in the form of a serial scan-out signal SO after the execution of the test. The scan paths 1 and 2 and the RAM core 91 constitute a RAM block 92.

FIG. 17 is a detailed circuit diagram of the RAM block 92. The scan path 1 comprises scan flip-flops 10 to 12, and the scan path 2 comprises scan flip-flops 20 to 22 and selectors 203, 213, and 223. Each of the scan flip-flops 10 to 12, and 20 to 22 includes a selector having a "0" input and a "1" input which are connected to an output thereof when a control signal is "0" and "1", respectively, and a flip-flop connected to the output of the selector.

FIG. 18 is a circuit diagram of the scan flip-flop 10. The scan flip-flop 10 comprises a selector 101 and a flip-flop 102. Other scan flip-flops may be similar in construction to the scan flip-flop 10. All of the scan flip-flops 10 to 12, and 20 to 22 shown in FIG. 17 receive a shift mode signal SM serving as a control signal therefor.

During a normal operation, the shift mode signal SM is set to "0", and the scan flip-flops 10 to 12 and the scan flip-flops 20 to 22 function as normal flip-flops provided at the inputs and outputs of the RAM core 91, respectively.

However, the scan flip-flops 20 to 22 of the scan path 2 provided at the output of the RAM core 91 sometimes perform their substantial function and sometimes do not, depending upon the function of the selectors 203, 213, and 223 for selectively providing the outputs from the scan flip-flops 20 to 22 and the outputs from the RAM core 91. More specifically, the RAM block 92 performs a synchronous/asynchronous read operation in response to the value "1"/"0" of a test mode signal TEST provided as a control signal for the selectors 203, 213, and 223. The term "synchronous" used herein means "in synchronization with" a clock essentially required for operation of flip-flops and the like and not shown.

During a test operation (logic test) for the logic region 80, the shift mode signal SM and the test mode signal TEST are set to "1" to cause the scan flip-flops 10 to 12, and 20 to 22 to sequentially shift the scan-in signal SI1 (in a scan mode) until test data are stored in the scan flip-flops 20 to 22.

The test data are applied to the logic portion 82. Since the scan path 1 receives the outputs (test result) from the logic portion 81, the scan flip-flops 10 to 12 store the test result therein.

In this manner, all of the scan flip-flops 10 to 12, and 20 to 22 are used for the logic test. However, when the synchronous write operation and asynchronous read operation are required as the functions of the RAM block 92, the scan paths 20 to 22 do not perform their substantial function during the normal operation. Additionally, the use of the scan path 3 is not required for testing only the RAM core 91. These facts cause an area overhead in the scan flip-flops 20 to 22 or the scan path 3, resulting in a low area utilization efficiency.

SUMMARY OF THE INVENTION

According to a first aspect of the present invention, a test circuit for performing a first test on first to third circuits comprises: a first scan path for receiving an output from the first circuit and a scan-in signal to selectively provide a parallel first output and a second output serving as a scan signal; a fourth circuit having a group of inputs for receiving the first output from the first scan path, and a group of outputs; a selecting means for selectively providing the first output from the first scan path and an output from the fourth circuit to the second circuit; and a second scan path for selectively providing the second output from the first scan path, an output from the second circuit, and the output from the fourth circuit to the third circuit, the test circuit performing a second test on the fourth circuit.

Preferably, according to a second aspect of the present invention, the second scan path has a data compressing function.

Preferably, according to a third aspect of the present invention, the second scan path constitutes an MISR circuit when the second scan path provides the output from the fourth circuit to the third circuit.

Preferably, according to a fourth aspect of the present invention, the second scan path includes data compression circuits provided in corresponding relation to respective bits of the output from the second circuit for conducting the data compressing function, each of the data compression circuits having: a scan flip-flop having a normal input for receiving the output from the second circuit, a scan input through which the scan signal is propagated, and an output; a selector having an output connected to the scan input of the scan flip-flop, and first and second inputs selectively connected to the output; and a logic circuit for providing an output to the first input of the selector, the logic circuit in each of the data compression circuits forming a loop for holding the output from the scan flip-flop therein in conjunction with the selector therein to provide a predetermined logic to the scan flip-flop when the result of the second test is defective, the scan signal being propagated through the second inputs of the selectors.

According to a fifth aspect of the present invention, a test circuit for performing a first test on first to fifth circuits comprises: a first scan path for receiving an output from the first circuit and a scan-in signal to selectively provide a parallel first output and a second output serving as a scan signal, the first output being applied to the second circuit; selecting means for selectively providing the first output from the first scan path and an output from the second circuit to the fifth circuit; and a second scan path for selectively providing the second output from the first scan path, an output from the third circuit, and an output from the fifth circuit, the test circuit performing a second test on the fifth circuit.

In the test circuit of the first aspect according to the present invention, (1) the first circuit, the first scan path, the fourth circuit, the second circuit, the second scan path, and the third circuit are connected in this sequence when the selecting means selectively provides the output from the fourth circuit to the second circuit and the second scan path selectively provides the output from the second circuit to the third circuit. Thus, data are synchronously inputted to and asynchronously outputted from the fourth circuit.

Additionally, (2) the first circuit, the first scan path, the second circuit, the second scan path, and the third circuit are connected in this sequence for execution of the first test when the selecting means selectively provides the first output from the first scan path to the second circuit and the second scan path selectively provides one of the second output from the first scan path and the output from the second circuit to the third circuit.

Furthermore, (3) when the second scan path provides the output from the fourth circuit to the third circuit, the fourth circuit is surrounded by the first and second scan paths independently of the operation of the selecting means. Thus, the second test may be performed on the fourth circuit without involvement of the second circuit.

When neither the first nor second test is performed, data are synchronously inputted to and asynchronously outputted from the fourth circuit. Since the second scan path is used for execution of both the first and second tests, these two operations may be performed with a suppressed area overhead. No involvement of the fourth circuit during the execution of the first test eliminates the need to initialize the fourth circuit when the first test is performed on the first to third circuits.

In the test circuit of the second aspect according to the present invention, when the output from the fourth circuit which receives a plurality of inputs is examined in the second test performed on the fourth circuit, it is not necessary for the second scan path to shift out the test result for each of the inputs. The test result should be shifted out after the second test is executed on all of the inputs. This provides the benefit of reducing the test time.

In the test circuit of the third aspect according to the present invention, the MISR circuit compresses the test result when the second test is performed on the fourth circuit. Thus, the signature analysis may judge whether the fourth circuit is defective or not.

In the test circuit of the fourth aspect according to the present invention, the logic circuit fixes the predetermined logic in the scan flip-flop once a failure occurs in the second test result for each bit of the output from the fourth circuit. In this manner, the presence of the failure is stored. Thus, whether the compressed test result is defective or not is provided.

In the test circuit of the fifth aspect according to the present invention, (1) the first circuit, the first scan path, the second circuit, the fifth circuit, the third circuit, the second scan path, and the fourth circuit are connected in this sequence when the selecting means selectively provides the output from the second circuit to the fifth circuit and the second scan path selectively provides the output from the third circuit to the fourth circuit. Thus, data are asynchronously inputted to and outputted from the fifth circuit.

Additionally, (2) the first circuit, the first scan path, the second circuit, the fifth circuit, the third circuit, the second scan path, and the fourth circuit are connected in this sequence for execution of the first test when the selecting means selectively provides the output from the second circuit to the fifth circuit and the second scan path selectively provides one of the second output from the first scan path and the output from the third circuit to the fourth circuit.

Furthermore, (3) when the selecting means provides the first output from the first scan path to the fifth circuit and the second scan path provides the output from the fifth circuit to the fourth circuit, the fifth circuit is surrounded by the first and second scan paths. Thus, the second test may be performed on the fifth circuit without involvement of the second and fourth circuits.

When neither the first nor second test is performed, data are asynchronously inputted to and outputted from the fifth circuit. Since the second scan path is used for execution of both the first and second tests, these two operations may be performed with a suppressed area overhead.

It is therefore an object of the present invention to provide a construction of a scan path with a high area utilization efficiency.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
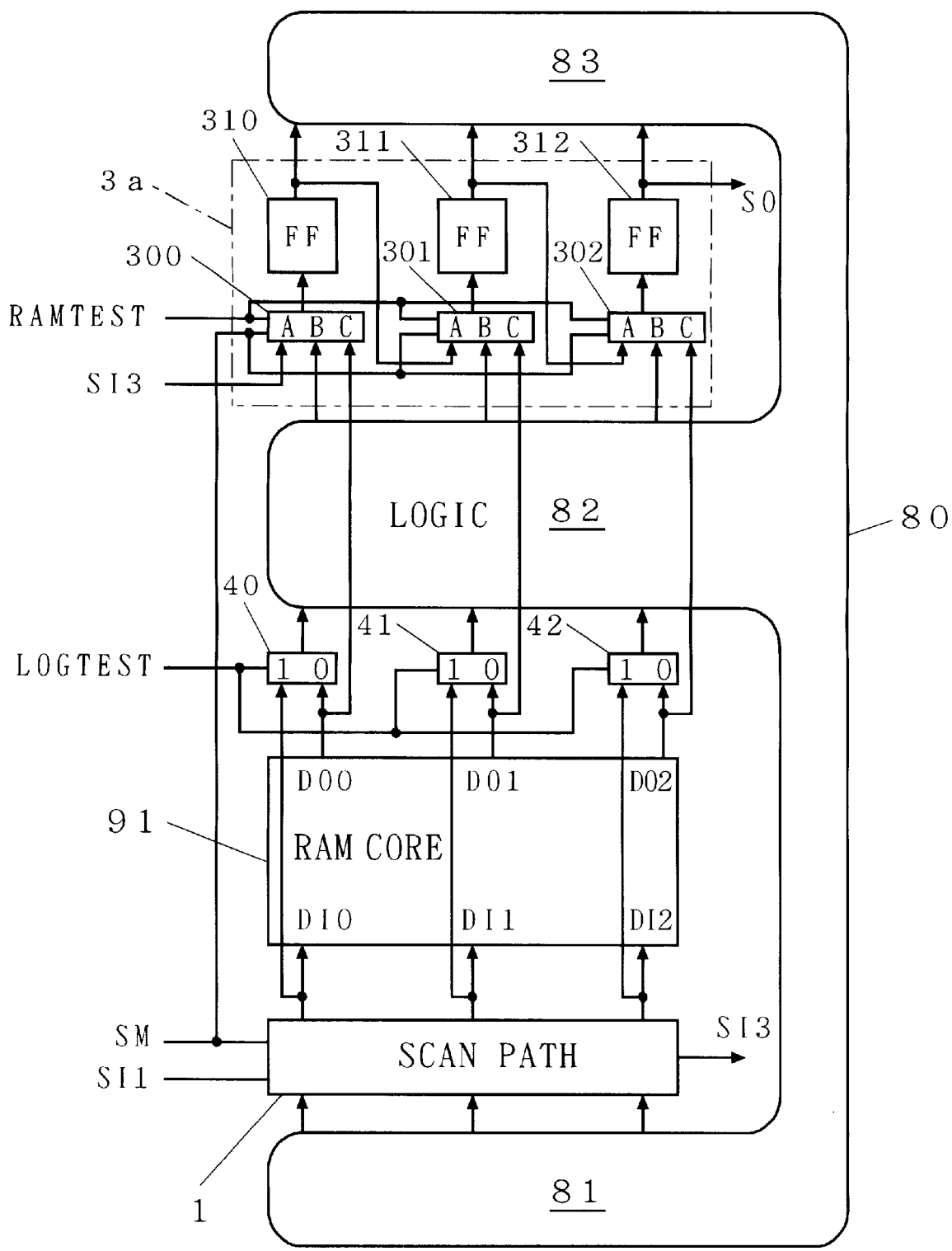
FIG. 1 is a block diagram illustrating the basic concept of a first preferred embodiment according to the present invention.

FIG. 1 is a block diagram illustrating the basic concept of a first preferred embodiment according to the present invention. A scan path 1 receives outputs from a logic portion 81 of a logic region 80 and a scan-in signal SI1 and is controlled by a shift mode signal SM serving as a control signal.

Outputs from the scan path 1 except a scan signal SI3 are applied to inputs DI0 to DI2 of a RAM core 91.

Selectors 40 to 42 are provided in place of the scan path 2 of the background art circuit. The selectors 40 to 42 have "1" inputs connected to the inputs DI0 to DI2 of the RAM core 91, and "0" inputs connected to outputs DO0 to DO2 of the RAM core 91, respectively. Outputs from the selectors 40 to 42 are applied to a logic portion 82. The selectors 40 to 42 are controlled by a logic test signal LOGTEST in such a manner that the value "0" or "1" of the logic test signal LOGTEST determines whether the outputs from the scan path 1 except the scan signal SI3 or the outputs from the RAM core 91 are applied to the logic portion 82.

A scan path 3a is located in a position corresponding to the scan path 3 of the background art circuit, and is provided between the logic portion 82 and a logic portion 83 and in series with the scan path 1. The scan path 3a comprises selectors 300 to 302 each of which selectively outputs one of three inputs A, B, and C, and flip-flops 310 to 312. The selectors 300 to 302 are controlled by both a RAM test signal RAMTEST and the shift mode signal SM. The input A of each of the selectors 300 to 302 receives a scan signal to be shifted, the input B thereof receives an output from the logic portion 82, and the input C thereof receives an output from the RAM core 91.

Figure 2:
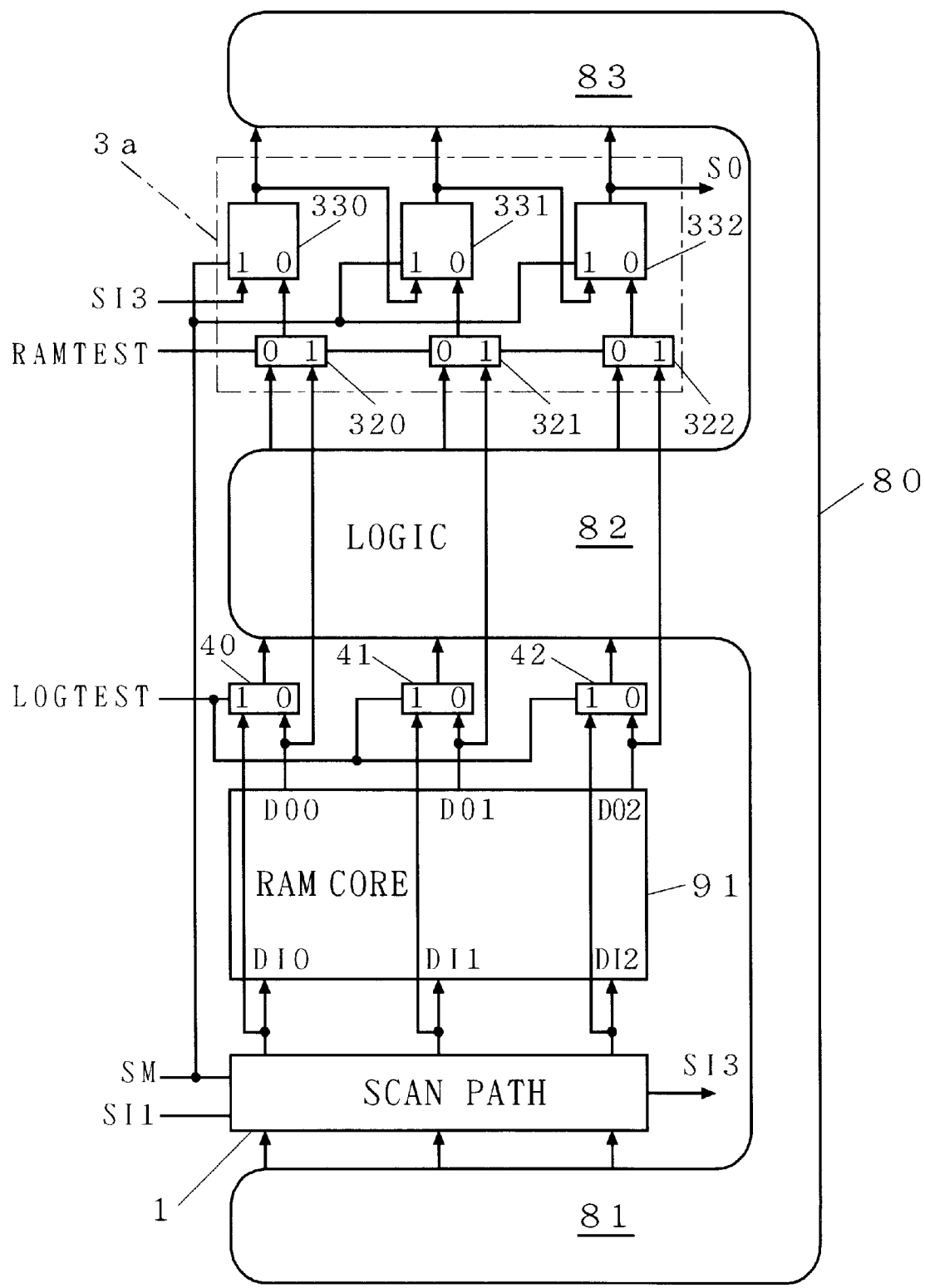
FIG. 2 is a block diagram illustrating a specific construction of the first preferred embodiment according to the present invention.
Figure 18:
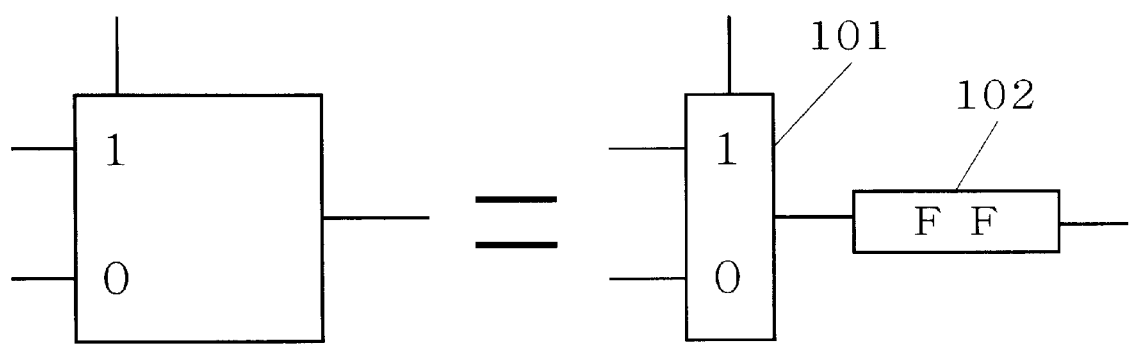
FIG. 18 is a circuit diagram of a scan flip-flop 10.

FIG. 2 is a block diagram illustrating a specific construction of the first preferred embodiment according to the present invention. Each of the selectors 300 to 302 shown in FIG. 1 may be comprised of a pair of two-input one-output selectors receiving the RAM test signal RAMTEST and the shift mode signal SM as control signals. As illustrated in FIG. 18, a two-input one-output selector and flip-flop pair constitutes a scan flip-flop. Thus, a combination of the selector 300 and the flip-flop 310 may be achieved by a combination of a selector 320 controlled by the RAM test signal RAMTEST and a scan flip-flop 330 controlled by the shift mode signal SM. Likewise, combinations of the selectors 301, 302 and the flip-flops 311, 312 may be achieved by combinations of selectors 321, 322 and scan flip-flops 331, 332.

Each of the scan flip-flops 330 to 332 has a "1" input serving as a scan input through which a scan signal is propagated, and a "0" input serving as a normal input for receiving an input signal when the scan flip-flops 330 to 332 function as normal flip-flops.

The arrangement shown in FIG. 2 operates in three modes to be described below.

(1) Normal mode

Figure 17:
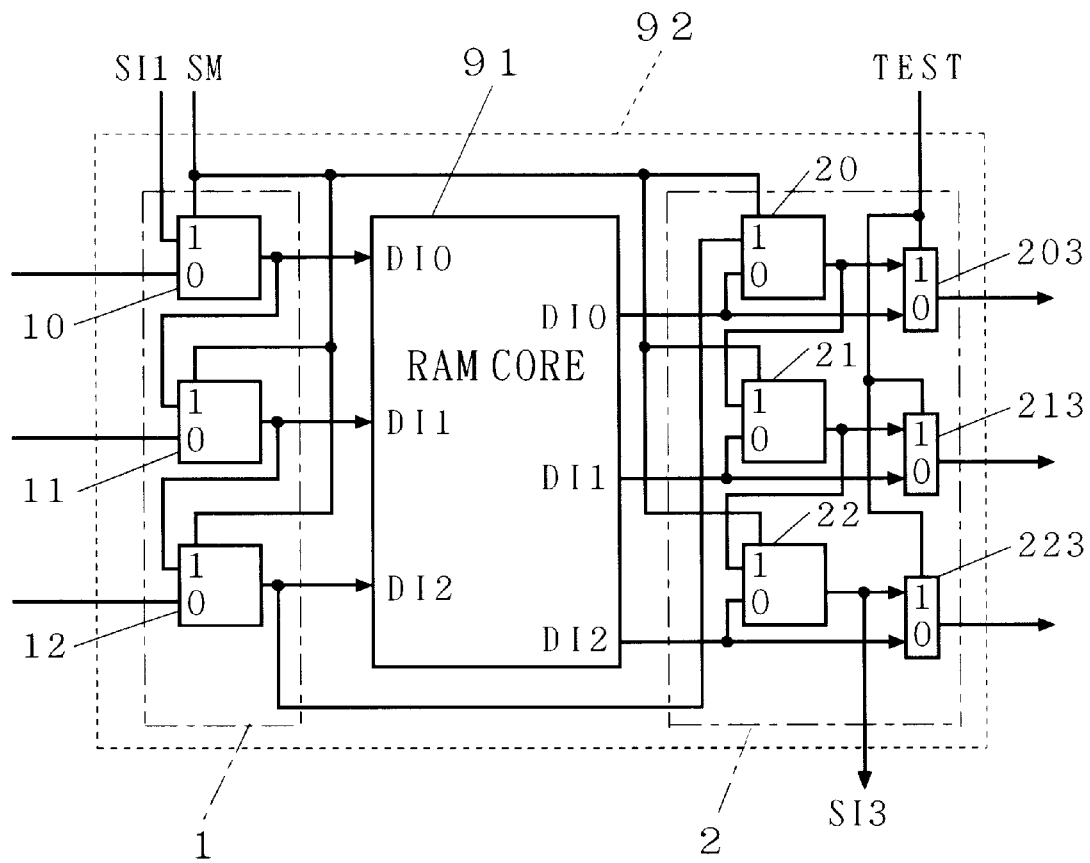
FIG. 17 is a detailed circuit diagram of a RAM block 92.

In the normal mode, the logic test signal LOGTEST, the RAM test signal RAMTEST, and the shift mode signal SM are set to "0". Setting the shift mode signal SM to "0" causes the flip-flops (FIGS. 17 and 18, e.g., the flip-flop 102) in the scan flip-flops 10 to 12 constituting the san path 1 to synchronously apply input signals to the RAM core 91. The logic test signal LOGTEST which is "0" causes the selectors 40 to 42 to asynchronously apply the outputs from the RAM core 91 to the logic portion 82. That is, the write operation into the RAM core 91 is synchronous, and the read operation therefrom is asynchronous.

The RAM test signal RAMTEST which is "0" causes the selectors 320 to 322 to transmit the outputs from the logic portion 82 to the scan flip-flops 330 to 332. The shift mode signal SM which is "0" causes the scan flip-flops 330 to 332 to function as normal flip-flops provided between the logic portion 82 and the logic portion 83. Thus, the first preferred embodiment accomplishes the normal operation similar to that of the background art circuit, and yet the synchronous write operation and asynchronous read operation.

(2) Logic test mode

In the logic test mode, the RAM test signal RAMTEST is set to "0", and the logic test signal LOGTEST is set to "1". The RAM test signal RAMTEST which is "0" causes the selector 320 to 322 to transmit the outputs from the logic portion 82 to the scan flip-flops 330 to 332. The logic test signal LOGTEST which is "1" causes the outputs from the scan path 1 except the scan signal SI3 to bypass the RAM core 91 and be applied to the logic portion 82.

Figure 3:
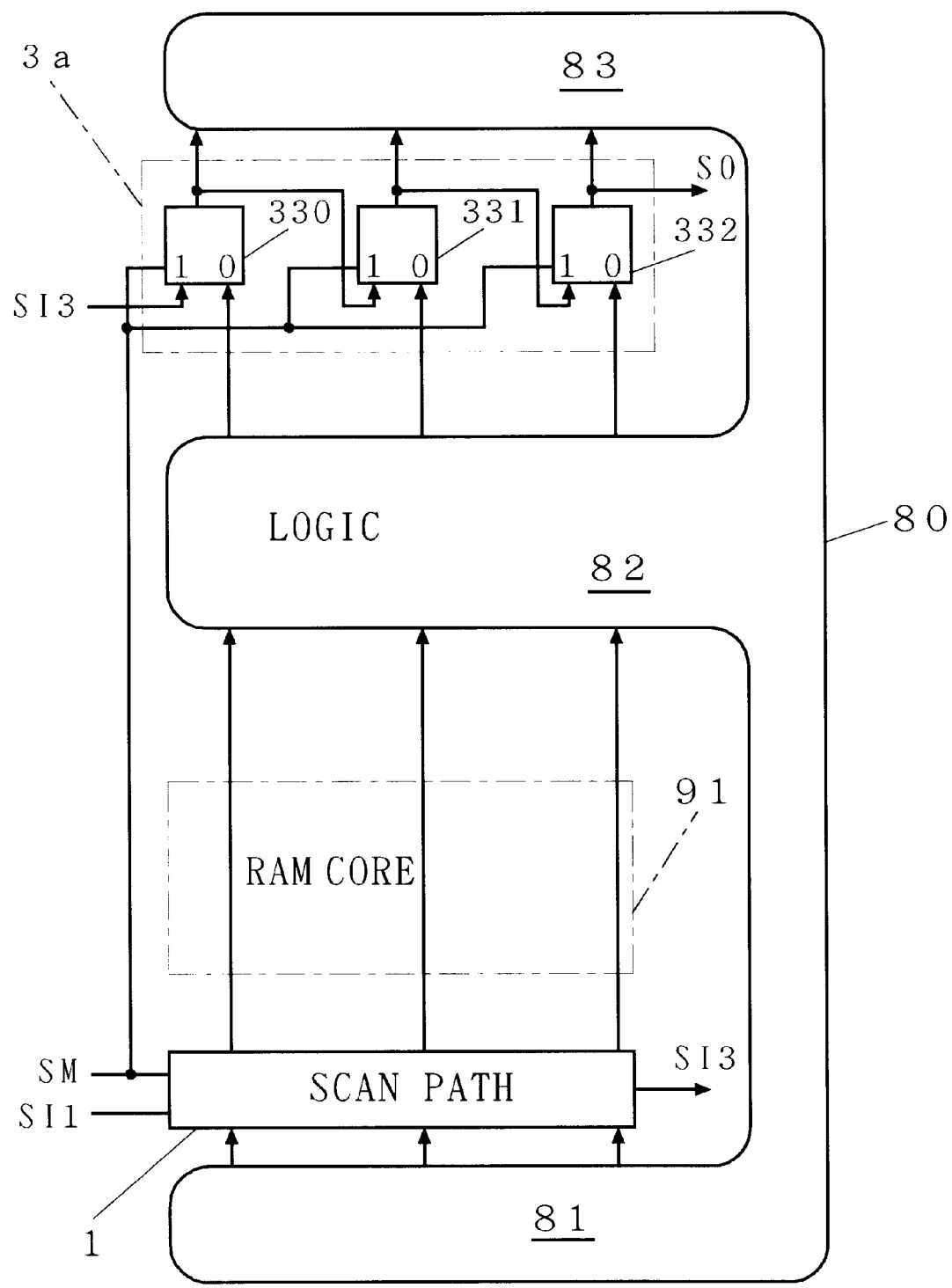
FIG. 3 is a block diagram of a circuit equivalent to the circuit of FIG. 2 in a logic test mode.

FIG. 3 is a block diagram of a circuit equivalent to the circuit of FIG. 2 in the logic test mode. The scan paths 1 and 3a controlled by the shift mode signal SM are provided between the logic portions 81 and 82 and between the logic portions 82 and 83, respectively. The scan paths 1 and 3a are connected in series to form one scan path. This eliminates the need to initialize the RAM core 91, achieving a logic test with a lesser number of test patterns.

(3) RAM test mode

In the RAM test mode, the RAM test signal RAMTEST is set to "1", and the logic test mode LOGTEST is set to "0". Then, the selectors 40 to 42, and 320 to 322 cause the outputs from the RAM core 91 to bypass the logic portion 82 and be transmitted to the scan flip-flops 330 to 332.

Figure 4:
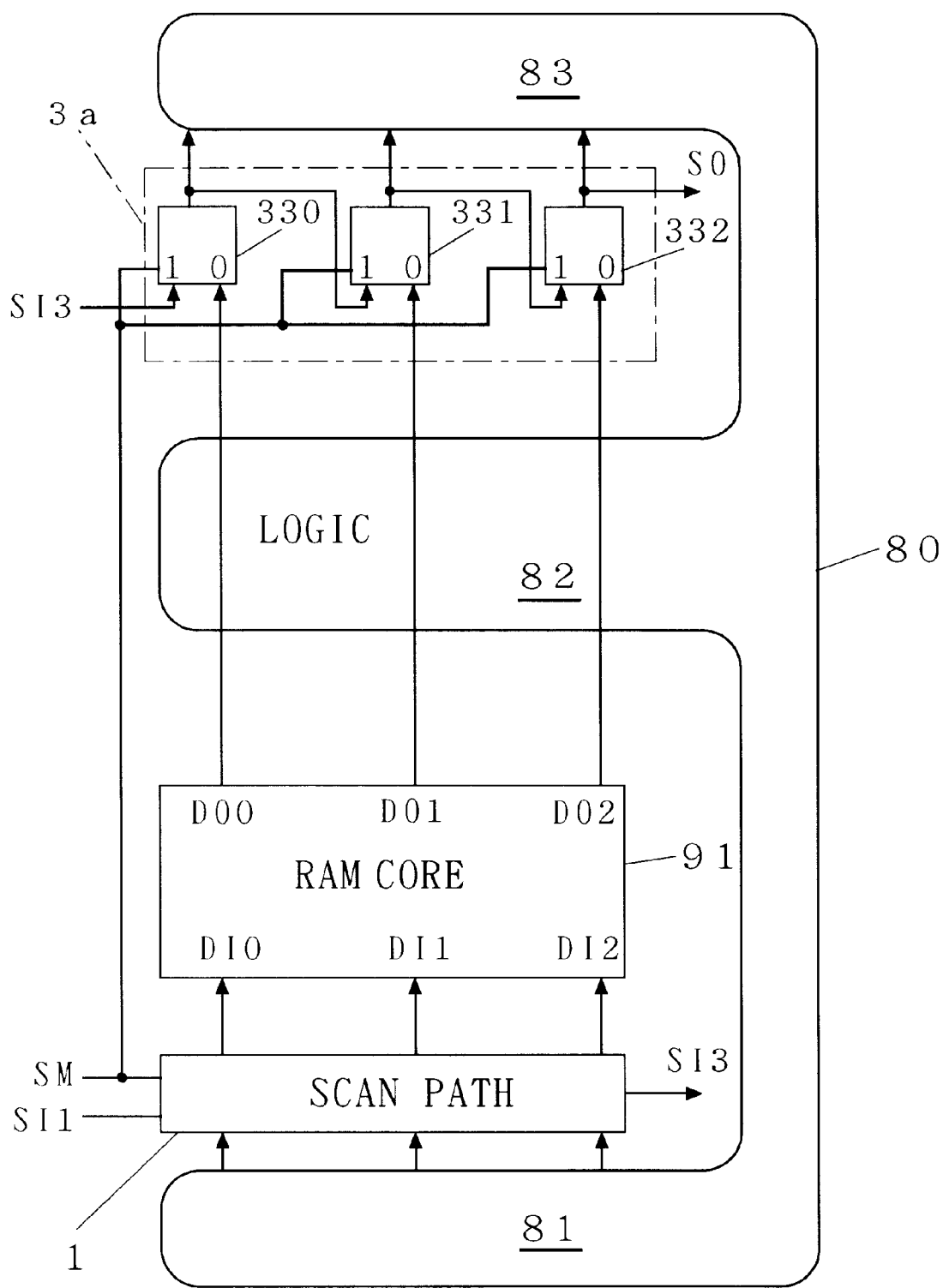
FIG. 4 is a block diagram of a circuit equivalent to the circuit of FIG. 2 in a RAM test mode.

FIG. 4 is a block diagram of a circuit equivalent to the circuit of FIG. 2 in the RAM test mode. The in-series connected scan paths 1 and 3a surround the RAM core 91, permitting only the RAM test to be performed.

In accordance with the first preferred embodiment, as above described, the scan path 3a may be used both as a scan path between the logic portions 82 and 83 in the logic test and as a scan path provided at the output of the RAM core 91 in the RAM test, eliminating the need for the background art scan path 2. Furthermore, the write operation and read operation are synchronous and asynchronous, respectively, during the normal operation.

The selectors 40 to 42 controlled by the logic test signal LOGTEST are substituted for the background art scan path 2. However, it will be understood that the first preferred embodiment requires fewer elements by the amount of the scan flip-flops 20 to 22. This decreases the area overhead to permit only the RAM core to be tested without lowering the area utilization efficiency.

In the circuit of FIGS. 1 and 2, another new scan path may be inserted between the scan paths 1 and 3a. Otherwise, the scan paths 1 and 3a may be connected in an interchanged sequence. In either case, the scan signal is transmitted, and there arises no problem.

Second Preferred Embodiment

Figure 5:
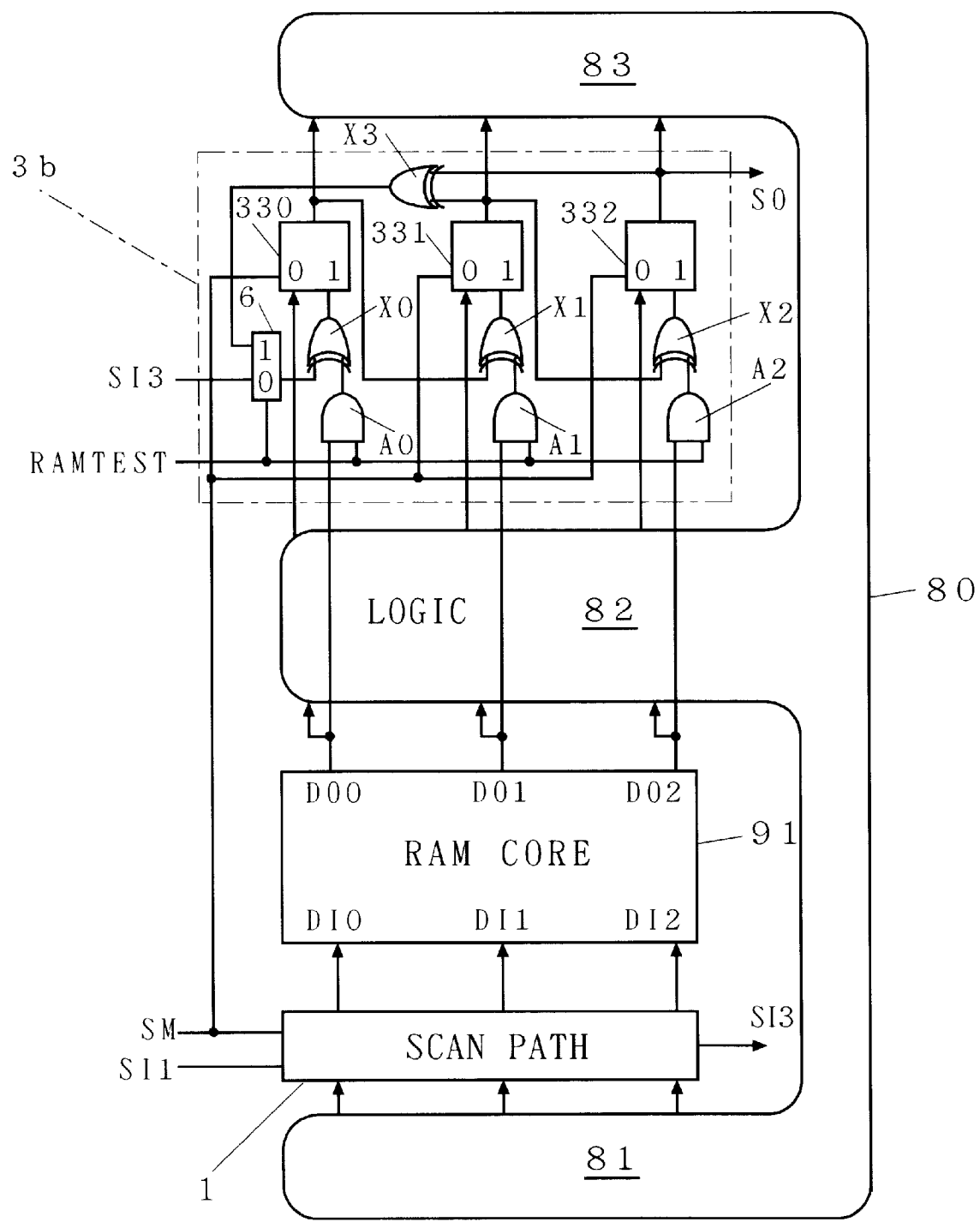
FIG. 5 is a block diagram of a second preferred embodiment according to the present invention.

FIG. 5 is a block diagram of a second preferred embodiment according to the present invention. The circuit of FIG. 5 is constructed such that the "0" input of each of the selectors 40 to 42 in the circuit of the first preferred embodiment shown in FIG. 1 is connected to the output thereof and such that the scan path 3a in the circuit of the first preferred embodiment is replaced with a scan path 3b.

The scan path 3b comprises an AND gate Ai, an exclusive-OR gate Xi, and a scan flip-flop 33i (i=0, 1, 2) for each output bit from the logic portion 82. The scan path 3b further comprises an exclusive-OR gate X3 and a selector 6. The RAM test signal RAMTEST is applied to first inputs of the AND gates A0 to A2. Outputs of the AND gates A0 to A2 are connected to first inputs of the exclusive-OR gate X0 to X2, respectively. The respective output bits from the RAM core 91 are applied to second inputs of the AND gate A0 to A2.

An output from the selector 6 is applied to a second input of the exclusive-OR gate X0. Outputs from the scan flip-flops 330 and 331 are applied to second inputs of the exclusive-OR gates X1 and X2, respectively. The selector 6 has a "0" input for receiving the scan signal SI3 from the scan path 1, and a "1" input for receiving the output from the exclusive-OR gate X3. The outputs from the scan flip-flops 331 and 332 are applied to the exclusive-OR gate X3.

The scan flip-flops 330 to 332 have "0" inputs for receiving the respective output bits from the logic portion 82, and "1" inputs for receiving the outputs from the exclusive-OR gates X0 to X2, respectively.

Figure 6:
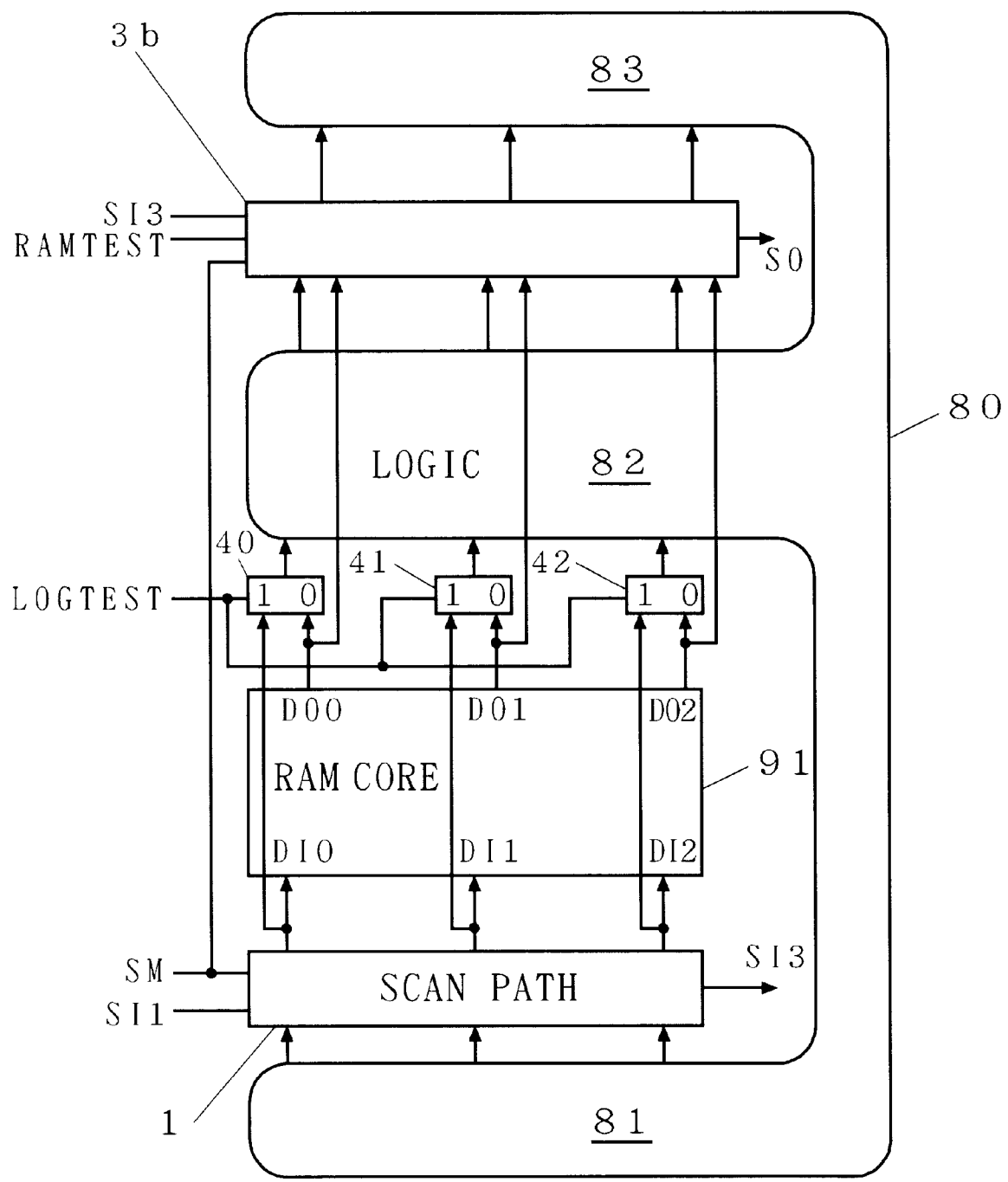
FIG. 6 is a block diagram of a modification of the second preferred embodiment according to the present invention.

FIG. 6 is a block diagram of a modification of the second preferred embodiment. As in the first preferred embodiment, the selectors 40 to 42 are provided between the RAM core 91 and the logic portion 82. The circuit of FIG. 6 wherein the logic test signal LOGTEST is set to "0" corresponds to the circuit of FIG. 5.

The arrangements shown in FIGS. 5 and 6 operate in three modes to be described below.

(1) Normal mode

In the normal mode, the shift mode signal SM is set to "0". The arrangement of FIG. 6 wherein the logic test signal LOGTEST is also set to "0" is equivalent to that of FIG. 5.

Setting the shift mode signal SM to "0" causes the scan path 1 to synchronously apply input signals to the RAM core 91. The shift mode signal SM which is "0" causes the scan flip-flops 330 to 332 to function as normal flip-flops for receiving the outputs from the logic portion 82 to provide outputs to the logic portion 83. Since the data applied to the "1" inputs of the scan flip-flops 330 to 332 do not contribute to the normal mode, the RAM test signal RAMTEST may have any value (Don't Care).

As above discussed, the second preferred embodiment accomplishes the normal operation similar to that of the background art circuit, and yet the synchronous write operation and asynchronous read operation.

(2) Logic test mode

In the logic test mode, the RAM test signal RAMTEST is set to "0". The arrangement of FIG. 5 will be discussed first.

Figure 7:
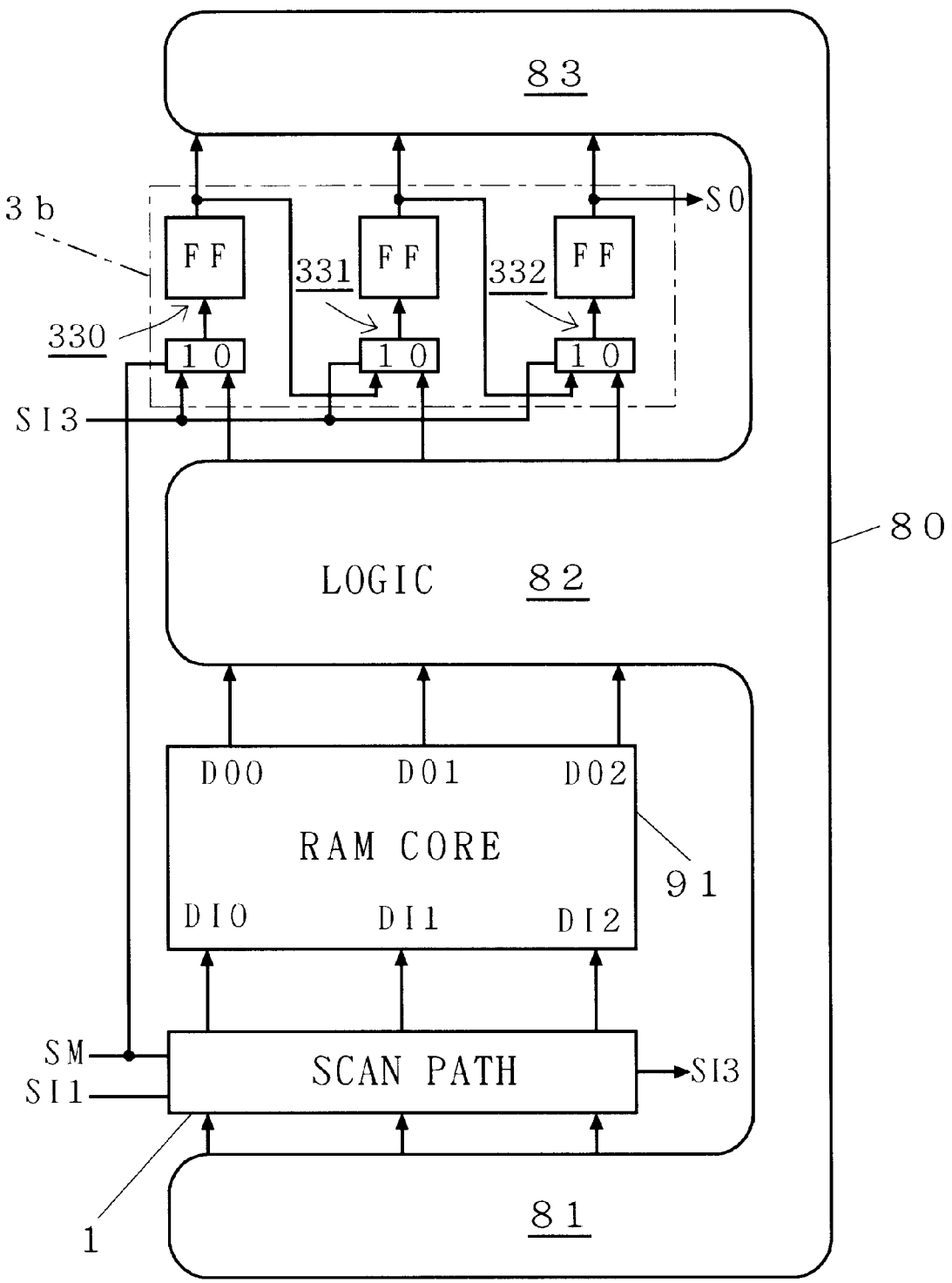
FIG. 7 is a block diagram of a circuit equivalent to the circuit of FIG. 5 when a RAM test signal RAMTEST is "0"

FIG. 7 is a block diagram of a circuit equivalent to the circuit of FIG. 5 wherein the RAM test signal RAMTEST is set to "0". Since the AND gates A0 to A2 output "0" independently of the data at their second inputs, the exclusive-OR gates X0 to X2 output the data at their second inputs.

The selector 6 outputs the scan signal SI3 at its "0" input which is in turn applied to the "1" input of the scan flip-flop 330. The output from the exclusive-OR gate X3 varies depending upon the outputs from the scan flip-flops 331 and 332 but is applied to the "1" input of the selector 6. Thus, the output from the exclusive-OR gate X3 does not contribute to the logic test mode.

In this manner, parallel data are propagated through the scan path 1, the RAM core 91, the logic portion 82, the scan path 3b, and the logic portion 83 in this sequence, and the logic test is performed.

In the modification of the second preferred embodiment shown in FIG. 6, on the other hand, the logic test signal LOGTEST is set to "1". Then, the outputs from the scan path 1 except the scan signal SI3 bypass the RAM core 91 and are applied to the logic portion 82.

As compared with the arrangement of FIG. 5, the arrangement of FIG. 6 is not required to initialize the RAM core 91 in the logic test, providing an additional advantage in that the number of test patterns for the logic test is decreased.

(3) RAM test mode

In the RAM test mode, the RAM test signal RAMTEST and the shift mode signal SM are set to "1". Setting the shift mode signal SM to "1" causes the outputs from the logic portion 82 not to contribute to the RAM test mode. Accordingly, the data applied to the logic portion 82 do not contribute to the RAM test mode. Therefore, the logic test signal LOGTEST may have any value in the circuit of FIG. 6.

Figure 8:
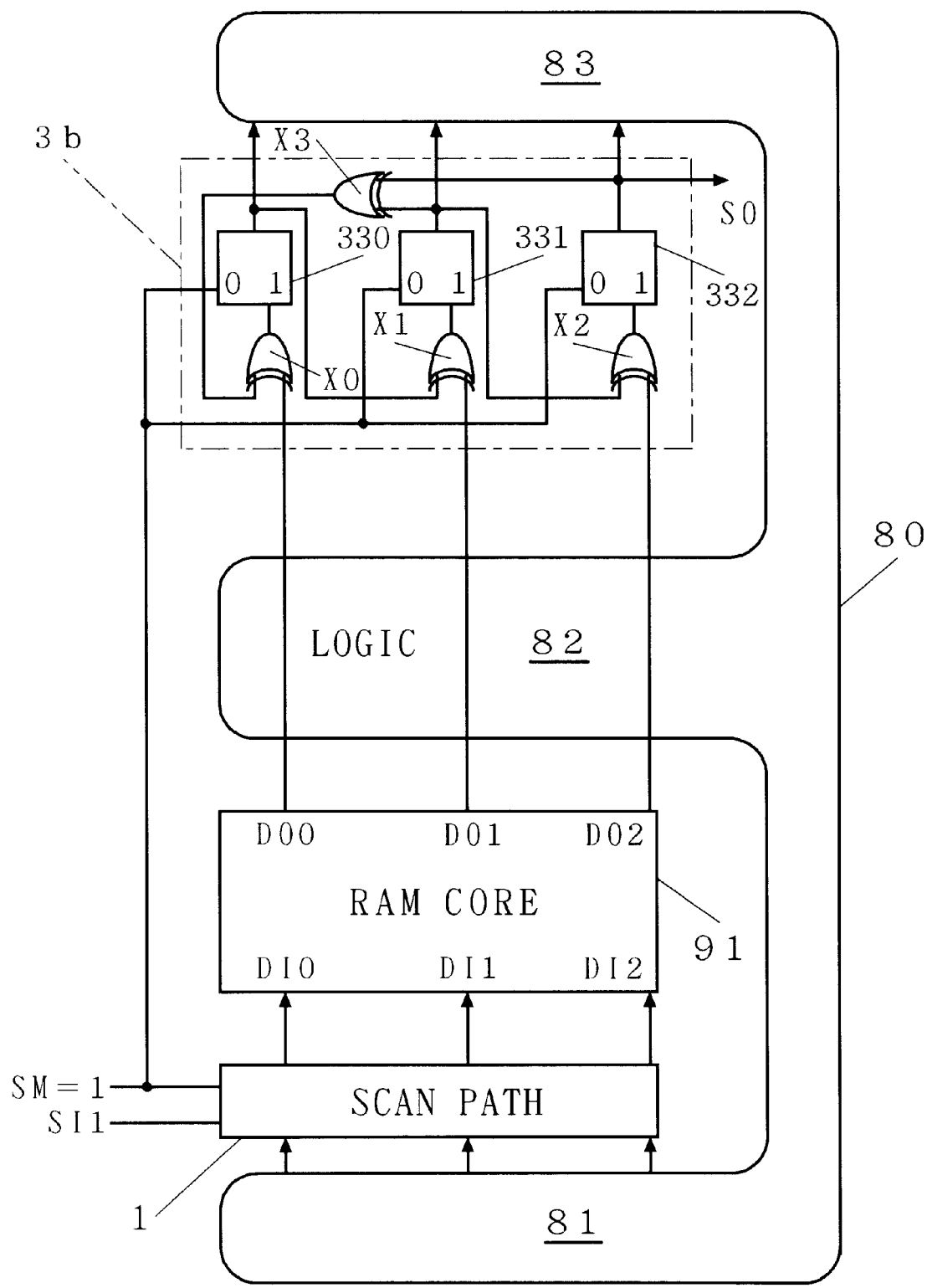
FIG. 8 is a block diagram of a circuit equivalent to the circuits of FIGS. 5 and 6 in the RAM test mode.

FIG. 8 is a block diagram of a circuit equivalent to the circuits of FIGS. 5 and 6. As in the first preferred embodiment, the in-series connected scan paths 1 and 3b surround the RAM core 91, permitting only the RAM test to be performed.

The selector 6 provides the output from the exclusive-OR gate X3 to the second input of the exclusive-OR gate X0. Since the AND gates A0 to A2 output the data at their second inputs, the first inputs of the exclusive-OR gates X0 to X2 receive the outputs from the RAM core 91. Thus, the exclusive-OR gates X0 to X3 and the scan flip-flops 330 to 332 constitute a multi input signature register (MISR) circuit used frequently as a multi-input data compression circuit. The result of the RAM test outputted from the RAM core 91 is received and compressed by the MISR circuit.

The procedure of the RAM test execution is briefly described below. Previously, (1) test data are written from the scan path 1 into all addresses of the RAM core 91, and (2) the contents of the scan flip-flops 330 to 332 are initialized to "0". This is achieved by setting the RAM test signal RAMTEST and the scan signal SI3 to "0" in the states shown in FIGS. 5 and 6.

Then, with the RAM test signal RAMTEST being "1", the circuit shown in FIG. 8 is provided, and (3) data of the RAM test result are read from all addresses of the RAM core 91. These data are compressed by the scan path 3b constituting the MISR circuit. Then, (4) the RAM test signal RAMTEST is set again to "0", and the test result held in the scan path 3b is shifted out as a scan-out signal SO.

The contents of the scan-out signal SO are compared with a test result provided by previous simulation performed on the test data (signature analysis). This permits the detection of a failure in the RAM core 91.

In this manner, the scan path 3b for receiving the outputs from the RAM core 91 has the data compressing function. The first preferred embodiment requires the shift-out of the test result for each address in the RAM test. In the second preferred embodiment, however, the test result is shifted after all addresses are tested. Therefore, the second preferred embodiment provides the benefit of shortening the test time in addition to the benefit of requiring fewer elements by the amount of the scan flip-flops 20 to 22 as in the first preferred embodiment.

Third Preferred Embodiment

Figure 9:
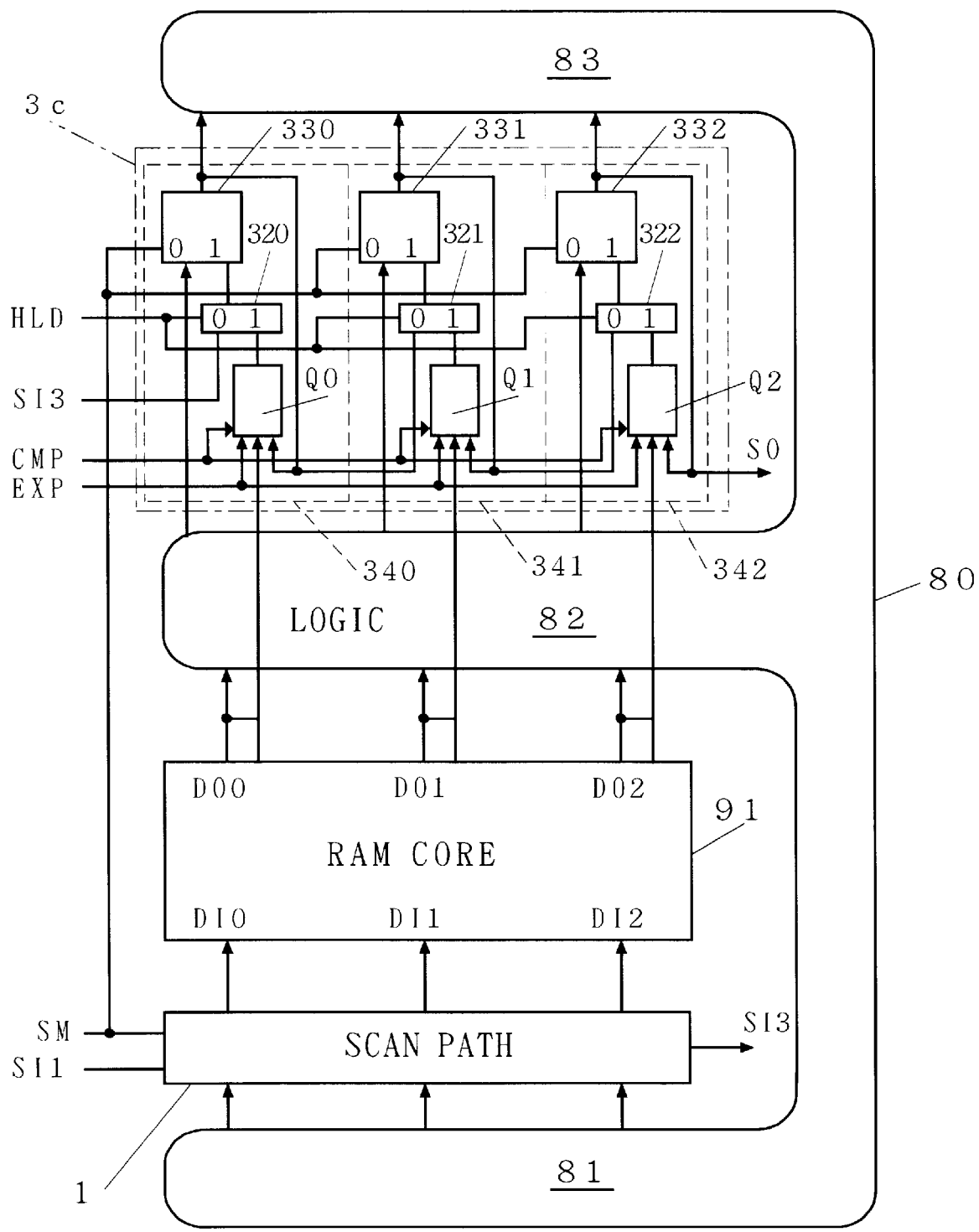
FIG. 9 is a block diagram of a third preferred embodiment according to the present invention.

FIG. 9 is a block diagram of a third preferred embodiment according to the present invention. The circuit of FIG. 9 is constructed such that the "0" input of each of the selectors 40 to 42 in the circuit of the first preferred embodiment shown in FIG. 1 is connected to the output thereof and such that the scan path 3a in the circuit of the first preferred embodiment is replaced with a scan path 3c.

The scan path 3c comprises data compression circuits 340 to 342 for receiving the outputs from the logic portion 82 and the outputs from the RAM core 91. The data compression circuits 340 to 342 are provided in corresponding relation to the respective bits to allow a failure position to be specified on the basis of the test result.

Each of the data compression circuits 340 to 342 (34i) comprises a gate group Qi, a scan flip-flop 33i having a "0" input receiving the output from the logic portion 82 and controlled by the shift mode signal SM, and a selector 32*i* having an output connected to the "1" input of the scan flip-flop 33*i*. The scan signal SI3 is applied to the "0" input of the selector 320, and the outputs from the flip-flops 330 and 331 are applied to the "0" inputs of the selectors 321 and 322, respectively.

The gate group Qi receives an output bit from the RAM core 91, an expectation signal EXP, a comparison control signal CMP, and the output from the flip-flop 33*i* to provide an output to the "1" input of the selector 32*i*.

The RAM test signal RAMTEST controls the operation of the selector 32*i* in the first preferred embodiment. In the third preferred embodiment, a hold signal HLD controls the operation of the selector 32*i*.

Figure 10:
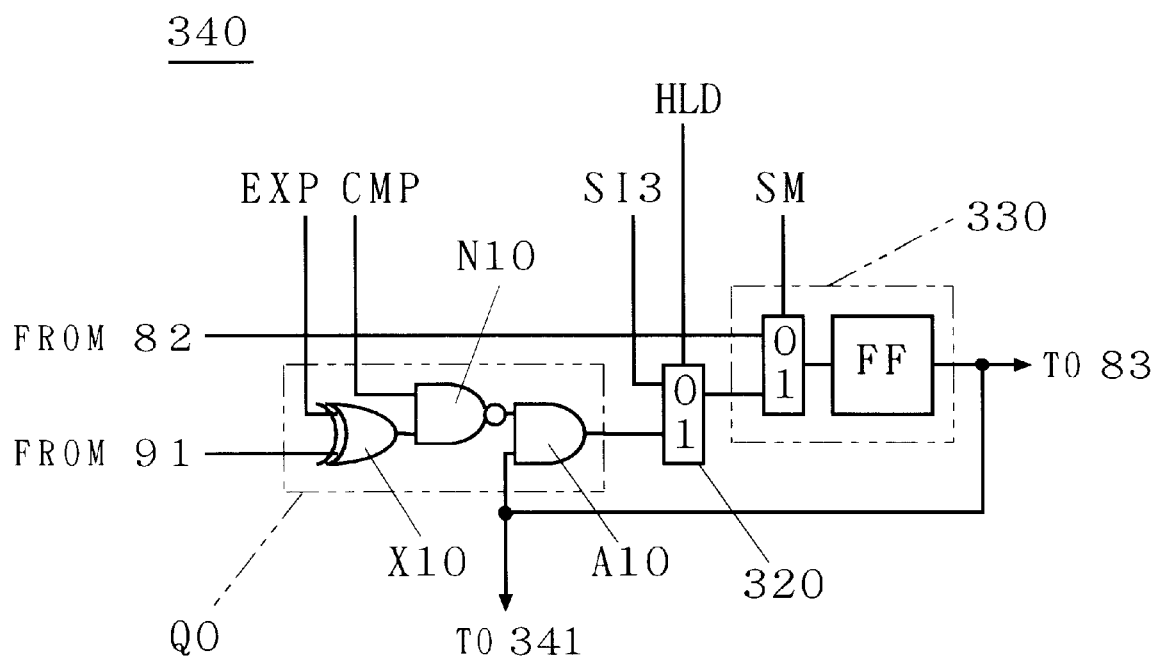
FIG. 10 is a detailed circuit diagram of a gate group Q0.

FIG. 10 is a detailed circuit diagram of the data compression circuit 340 and, particularly, the gate group Q0. Other data compression circuits 341 and 342 are similar in construction to the data compression circuit 340. Such a construction is disclosed in, for example, Japanese Patent Application Laid-Open No. 8-94718 (1996), FIG. 11.

The gate group Qi comprises an exclusive-OR gate X1i, a NAND gate N1i, and an AND gate A1i. The exclusive-OR gate X1i has a pair of inputs receiving the output from the RAM core 91 and the expectation signal EXP. The NAND gate N1i has a pair of inputs receiving the output from the exclusive-OR gate X1i and the comparison control signal CMP. The AND gate A1i has a pair of inputs receiving the output from the NAND gate N1i and the output from the scan flip-flop 33*i*, and provides an output to the "1" input of the selector 32*i*.

Figure 11:
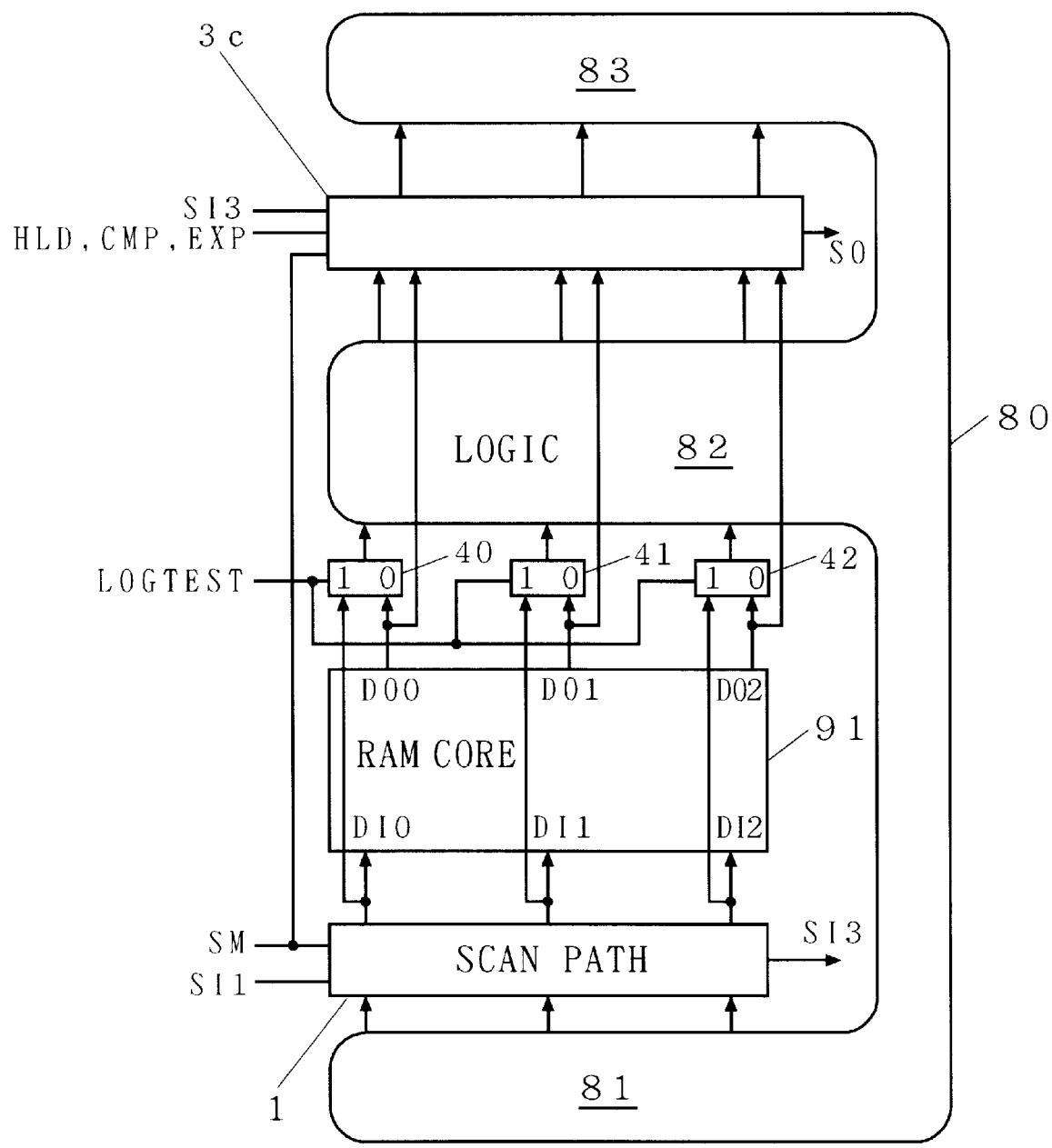
FIG. 11 is a block diagram of a modification of the third preferred embodiment according to the present invention.

FIG. 11 is a block diagram of a modification of the third preferred embodiment. As in the first preferred embodiment, the selectors 40 to 42 are provided between the RAM core 91 and the logic portion 82. The circuit of FIG. 11 wherein the logic test signal LOGTEST is set to "0" corresponds to the circuit of FIG. 9.

The arrangements shown in FIGS. 9 and 11 operate in three modes to be described below.

(1) Normal mode

In the normal mode, the shift mode signal SM is set to "0". The arrangement of FIG. 11 wherein the logic test signal LOGTEST is also set to "0" is equivalent to that of FIG. 9.

The shift mode signal SM which is "0" causes the scan path 1 to synchronously write the RAM core 91. The scan flip-flops 330 to 332 function as normal flip-flops for receiving the outputs from the logic portion 82 to provide outputs to the logic portion 83. The data at the "1" inputs of the scan flip-flops 330 to 332 do not contribute to the normal mode. Thus, the hold signal HLD may have any value.

In this manner, the third preferred embodiment accomplishes the normal operation similar to that of the background art circuit, and yet the synchronous write operation and asynchronous read operation.

(2) Logic test mode

In the logic test mode, the hold signal HLD is set to "0". The arrangement of FIG. 9 is first discussed. The selectors 320 to 322 and the flip-flops 330 to 332 are alternately connected in series to form a path, and the arrangement equivalent to that of FIG. 7 is provided. The described operation in the logic test mode of the second preferred embodiment is accomplished also in the third preferred embodiment.

In the modification of the third preferred embodiment illustrated in FIG. 11, the logic test signal LOGTEST is also set to "1". Then, the outputs from the scan path 1 except the scan signal SI3 bypass the RAM core 91 and are applied to the logic portion 82.

As compared with the arrangement shown in FIG. 9, the arrangement of FIG. 11 is not required to initialize the RAM core 91 in the logic test, providing an additional advantage in that the number of test patterns for the logic test is decreased.

(3) RAM test mode

Figure 12:
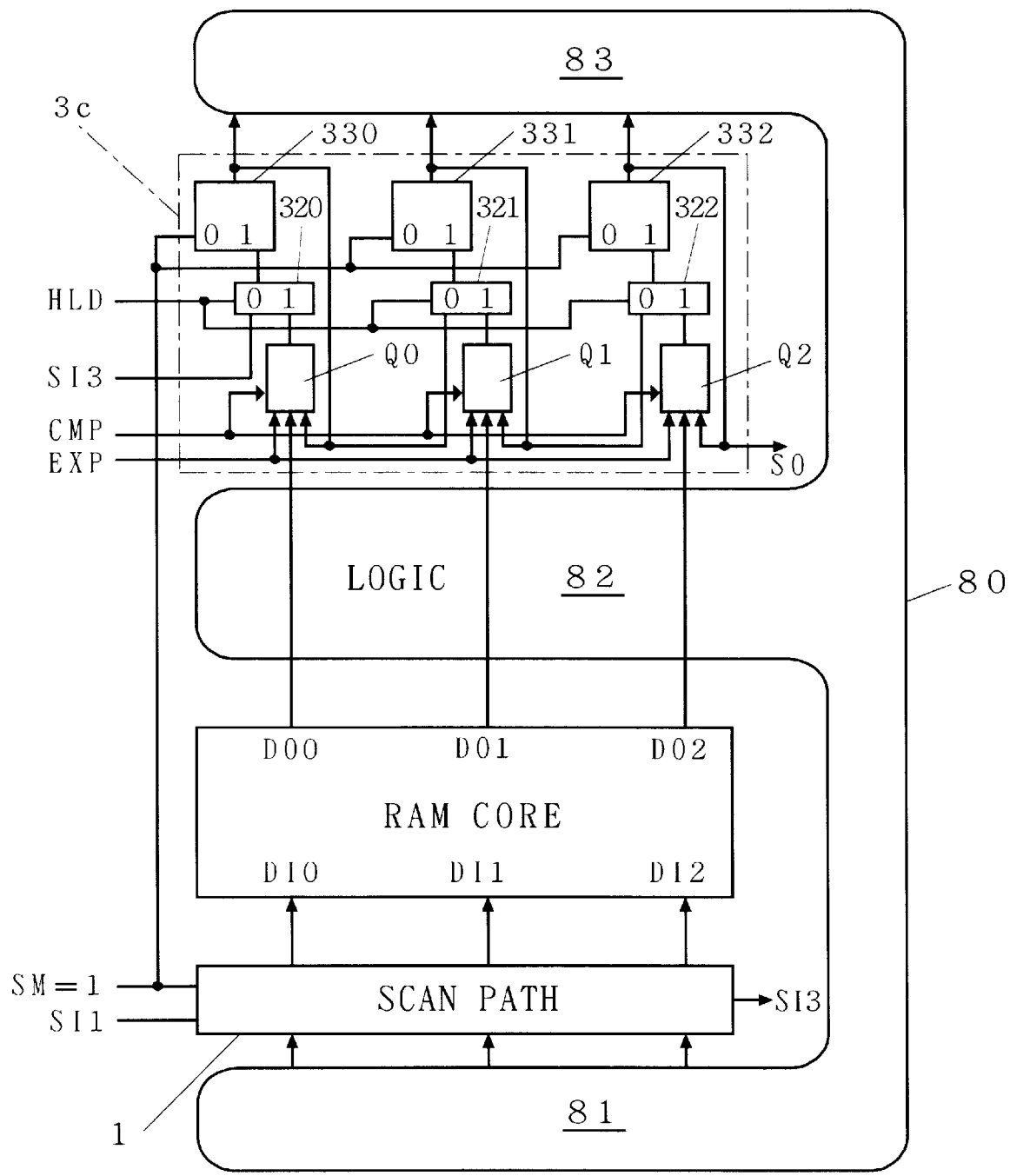
FIG. 12 is a block diagram of a circuit equivalent to the circuits of FIGS. 9 and 11 in the RAM test mode.

In the RAM test mode, the shift mode signal SM is set to "1". Thus, the outputs from the logic portion 82 do not contribute to the RAM test mode. Accordingly, the data applied to the logic portion 82 do not contribute to the RAM test mode. The logic test signal LOGTEST may have any value in the circuit of FIG. 11. Equivalent constructions of FIGS. 9 and 11 in the RAM test mode are illustrated in FIG. 12.

The specific procedure of the test, for example, for reading "0" from all addresses of the RAM which have been written with "0" will be briefly described below. First, (1) the hold signal HLD is set to "0" to form a path including the selectors 320 to 322 and flip-flops 330 to 332 which are alternately connected in series. Then, the scan-in signal SI1 is set to, for example, "1" to initialize all of the flip-flops 330 to 332 to "1". Then, (2) the hold signal HLD is set to "1" to form a loop using the AND gate A1i, the selector 32*i*, and the flip-flop 33*i*. At this point of time, the comparison control signal CMP is set to "0" to cause the NAND gate N1i to constantly output "1" to hold the logic "1" stored in the scan flip-flop 33*i*. On the other hand, the scan signal SI1 is set to "0" to write "0" into all addresses of the RAM core 91. Then, (3) the comparison control signal CMP is set to "1" while the hold signal HLD is held at "1". Until then, the expectation signal EXP has an expected value "0", and the RAM core 91 is read.

In relation to the output DO0 of the RAM core 91, the exclusive-OR gate X10 compares the data read from the output DO0 with the expected value to judge whether or not both of the data coincide. The NAND gate N10 inverts the result of the judgment to apply the inverted signal to the AND gate A10. If the read data are equal to the expected value "0", the AND gate A0 applies the logic "1" equal to the data stored in the scan flip-flop 330 to the selector 320. Thus, the value in the scan flip-flop 330 remains "1".

On the other hand, if the read data are not equal to the expected value, the AND gate A10 constantly outputs "0". Thus, once a failure is detected at the output DO0, the scan flip-flop 330 continues storing "0" therein. The same is true for the outputs DO1 and DO2.

Then, (4) the hold signal HLD is set to "0" and the comparison control signal CMP is set to "0" to cause the values stored in the scan flip-flops 330 to 332 during the execution of the test to be shifted out as the scan-out signal SO while maintaining their logic. The value "1" is detected for normal bits, and the value "0" is detected for faulty bits.

Like the second preferred embodiment, the third preferred embodiment has the data compressing function. The third preferred embodiment provides the additional benefit of being capable of specifying a failure position since the test result is compressed for each bit.

Fourth Preferred Embodiment

The arrangements of the first to third preferred embodiments are applicable when the RAM core 91 is asynchronously written and read.

Figure 13:
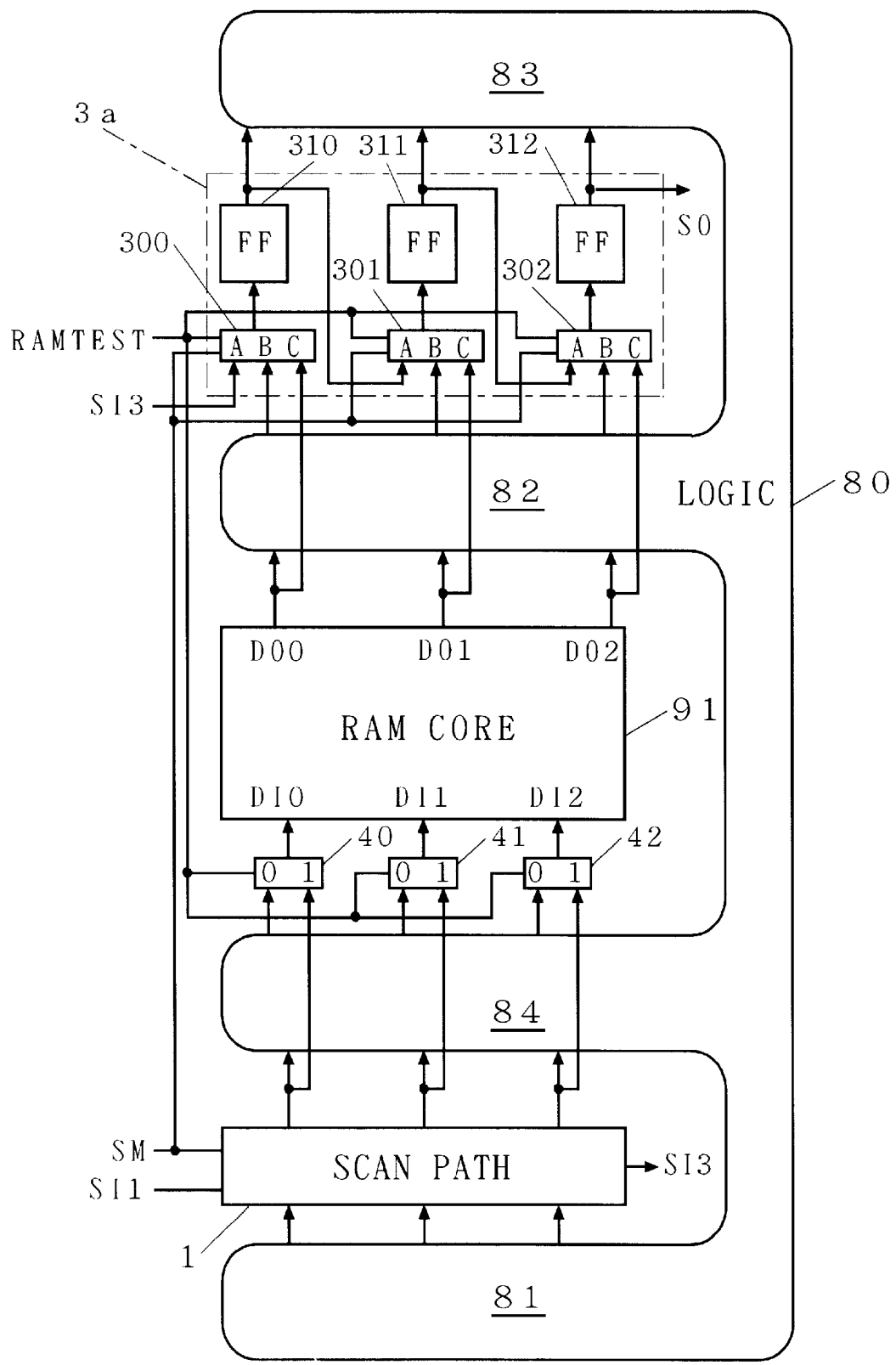
FIG. 13 is a block diagram of a fourth preferred embodiment according to the present invention.

FIG. 13 is a block diagram of a fourth preferred embodiment according to the present invention. The logic region 80 comprises logic portions 81 to 84. The scan path 1 is provided between the logic portions 81 and 84. The RAM core 91 is provided between the logic portions 84 and 82. The scan path 3*a* is provided between the logic portions 82 and 83.

The scan path 1 receives the outputs from the logic portion 81 and the scan-in signal SI1 to provide respective output bits to the logic portion 84. The scan path outputs the scan signal SI3 in order to transmit the scan signal.

The selectors 40 to 42 have "0" inputs for receiving the outputs from the logic portion 84, and "1" inputs for receiving the outputs from the scan path 1 except the scan signal SI3, respectively. The outputs from the selectors 40 to 42 function as inputs to the RAM core 91. The selectors 40 to 42 are controlled by the RAM test signal RAMTEST.

The scan path 3a of the fourth preferred embodiment is similar in construction to that of the first preferred embodiment described with reference to FIG. 1. The scan path 3a receives the RAM test signal RAMTEST and shift mode signal SM for controlling the selectors 300 to 302, the scan signal SI3, the outputs from the logic portion 82, and the outputs from the RAM core 91. The outputs from the RAM core 91 also function as inputs to the logic portion 82.

The arrangement shown in FIG. 13 operates in three modes to be described below as in the first preferred embodiment.

(1) Normal mode

In the normal mode, the RAM test signal RAMTEST is set to "0", and the selectors 40 to 42 transmit the outputs from the logic portion 84 as the inputs to the RAM core 91. The selectors 300 to 302 are set to output their inputs B (receiving the outputs from the logic portion 82). The shift mode signal SM is set to "0" when the scan path 3a has the construction shown in FIG. 2.

In this case, the RAM core 91 is asynchronously written since no flip-flops are provided between the logic portion 84 and the RAM core 91. On the other hand, the RAM core 91 is asynchronously read since the outputs from the RAM core 91 are applied to the logic portion 82 through no flip-flops. The flip-flops 310 to 312 are provided between the logic portions 82 and 83.

(2) Logic test mode

In the logic test mode, the RAM test signal RAMTEST is set to "0", and the selectors 300 to 302 are set to output their inputs A (through which the scan signal is transmitted) and their inputs B in response to the shift mode signal SM which is "1" and "0", respectively.

In this case, the scan path 1 is provided between the logic portions 81 and 84, the RAM core 91 is provided between the logic portions 84 and 82, and the scan flip-flops are provided between the logic portions 82 and 83. Thus, controlling the value of the shift mode signal SM permits the test data to be transmitted as the scan-in signal SI1 to provide the test result from the shift-out signal SO.

(3) RAM test mode

In the RAM test mode, the RAM test signal RAMTEST is set to "1", and the outputs from the scan path 1 are not passed through the logic portion 84 but are transmitted as the inputs to the RAM core 91 by the selectors 40 to 42. Since the selectors 300 to 302 are set to output their inputs C (receiving the outputs from the RAM 91), no data are transmitted between the scan path 3a and the RAM core 91 through the logic portion 82.

In this manner, the RAM core 91 has the inputs for receiving the test data from the scan path 1 and the outputs for providing the test result to the flip-flops 310 to 312. This allows only the RAM core 91 to be tested using the scan paths 1 and 3a.

As above described, the fourth preferred embodiment is similar in effect to the first preferred embodiment when the RAM core 91 is asynchronously written/read.

Of course, the scan paths 3b and 3c may be used to provide effects similar to those of the second and third preferred embodiments.

Fifth Preferred Embodiment

Figure 14:
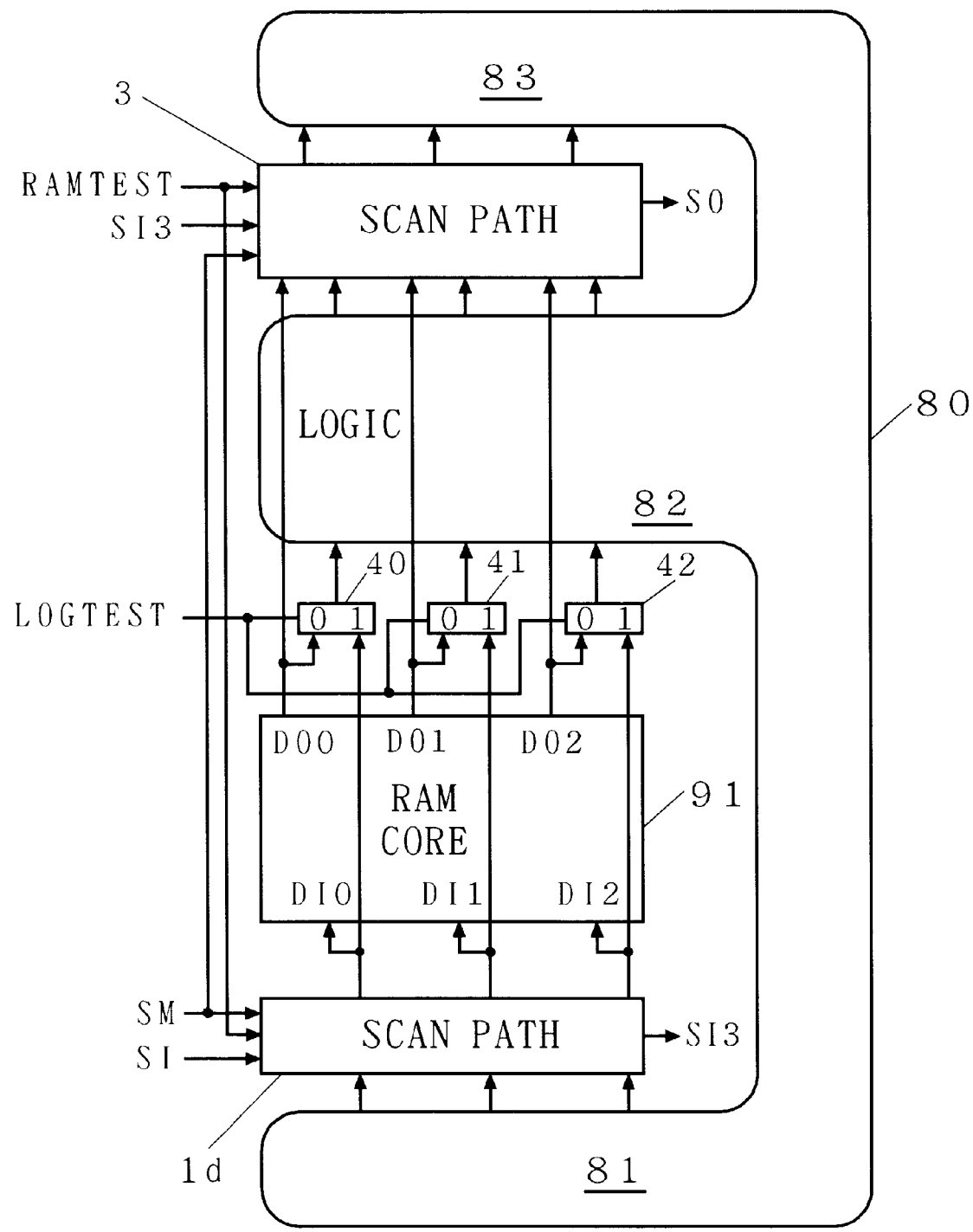
FIG. 14 is a block diagram of a fifth preferred embodiment according to the present invention.

FIG. 14 is a block diagram of a fifth preferred embodiment according to the present invention. In FIG. 14, the scan path 3a of FIG. 1 is generically denoted as a scan path 3. The scan path 1 is replaced with a scan path 1d.

Figure 15:
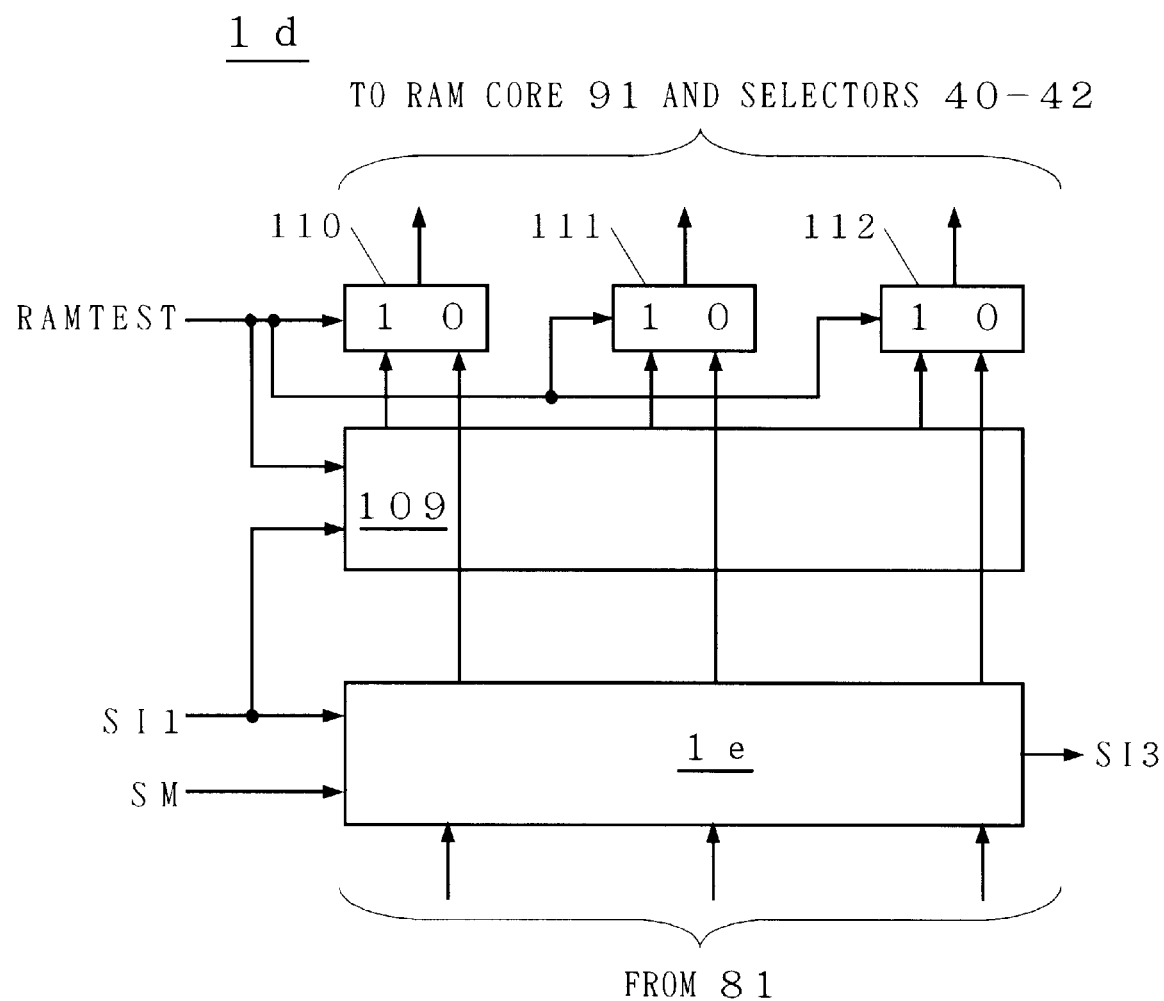
FIG. 15 is a block diagram of a scan path 1d.
Figure 16:
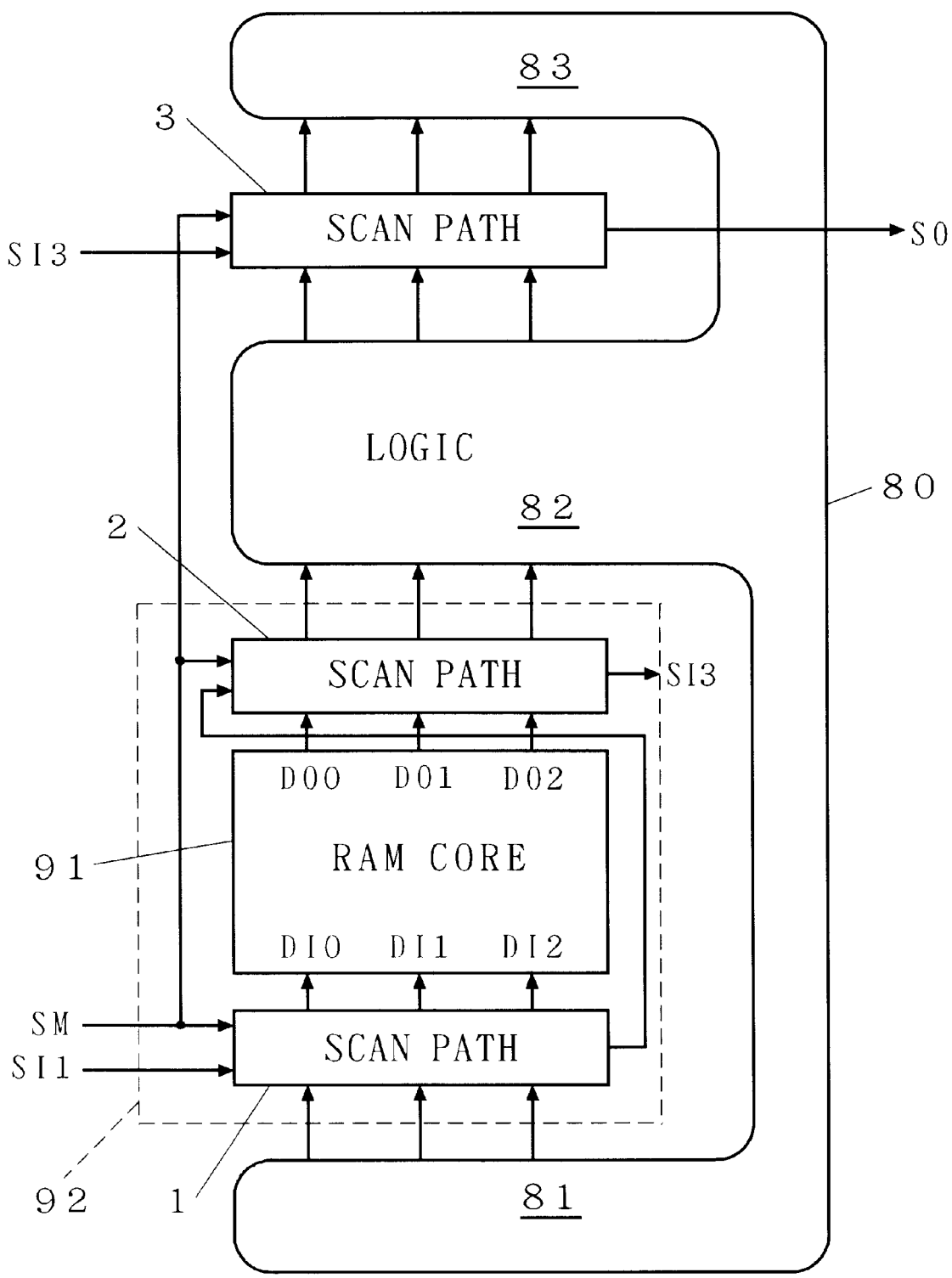
FIG. 16 is a block diagram of a background art test circuit.

FIG. 15 is a block diagram of the scan path 1d. The scan path 1d comprises a normal scan path 1e including in-series connected scan flip-flops (e.g., scan flip-flops 10 to 12 illustrated in FIG. 17), a data pattern generating circuit 109 for generating test data patterns for use in the RAM test, and selectors 110 to 112.

The scan path 1e receives the outputs from the logic portions 81, the scan-in signal SI1, and the shift mode signal SM to provide respective output bits to "0" inputs of the selectors 110 to 112, and to provide the scan signal SI3. The data pattern generating circuit 109 receives the RAM test signal RAMTEST and the shift-in signal SI1 to provide respective bits of test data to "1" inputs of the selectors 110 to 112.

When the RAM test signal RAMTEST is "0", the fifth preferred embodiment is similar in function to the first preferred embodiment because of the function of the selectors 110 to 112. When the RAM test signal RAMTEST is "1", that is, when the RAM test is executed, the outputs from the data pattern generating circuit 109 are applied to the RAM core 91. (During the RAM test, the selectors 40 to 42 do not transmit the outputs from the selectors 110 to 112 to other portions since the logic test signal LOGTEST is set to "0".)

The use of an LFSR (linear feedback shift register) circuit as a preferred example of the test pattern generating circuit 109 is advantageous in small area overhead. The data pattern generating circuit 109 is active when the RAM test signal RAMTEST is "1", and the scan-in signal SI1 may be used for initial value setting of the LFSR circuit.

As above described, the fifth preferred embodiment provides the benefit of providing the test data preferable for the RAM test from the scan path 1d during the RAM test in addition to the effect of the first preferred embodiment.

The scan path 3 may comprise the circuit for compressing the test result as discussed in the second and third preferred embodiments.

Other Modifications

Various modifications may be made to the first to fifth preferred embodiments. For example, although the RAM core 91 itself is asynchronously written/read in the above description, the present invention is applicable if the write/read operations of the RAM core 91 is synchronously designed.

Particularly for a synchronous RAM already designed as a hard macro, it is unnecessary (i) to additionally provide a test circuit inside the RAM, and (ii) to surround the RAM by scan paths to bypass these scan paths during the normal operation. Therefore, the present invention may avoid the re-design of the RAM and the increase in desired area to facilitate the test, providing particularly significant effects.

The RAM core 91 in the first to fifth preferred embodiments may be replaced with logic circuits which may be handled as one logic block. This is particularly effective when the test patterns are in the form of a library.

In the above described preferred embodiments, each of the scan flip-flops comprises the selector for receiving the normal data and the scan signal, and the flip-flop for receiving the output from the selector (FIG. 18).

For instance, the above described scan flip-flops may be replaced with scan flip-flops for receiving the normal data and the scan signal and having a clock for normal operation and a scan clock. In this case, effects similar to those of the first to fifth preferred embodiments are provided.

For example, a shift register latch for use in level sensitive scan design (LSSD) may be substituted for the scan flip-flops to provide effects similar to those of the first to fifth preferred embodiments.

While the invention has been described in detail, the foregoing description is in all aspects illustrative and not restrictive. It is understood that numerous other modifications and variations can be devised without departing from the scope of the invention.

We claim:

1. A test circuit for executing a first test from first to third circuits, comprising:

a first scan path for receiving an output from said first circuit and a scan-in signal to selectively provide a first output and a second output serving as a scan signal;

a fourth circuit having a group of inputs for receiving said first output from said first scan path, and a group of outputs;

a selecting means for selectively providing said first output from said first scan path and an output from said fourth circuit to said second circuit; and a second scan path for selectively providing said second output from said first scan path, an output from said second circuit, and the output from said fourth circuit to said third circuit;

said test circuit executing a second test applied to said fourth circuit.

2. The test circuit in accordance with claim 1, wherein said second scan path includes a plurality of selector and scan flip-flop pairs provided in corresponding relation to respective bits of the output from said second circuit, each of said scan flip-flops having a normal input for receiving an input when said flip-flops function as normal flip-flops, a scan input through which said scan signal is propagated, and an output, each of said selectors selectively providing the output from said second circuit and the output from said fourth circuit to said normal input of a corresponding one of said scan flip-flops, the output of one of said scan flip-flops being connected to said scan input of an adjacent one of said scan flip-flops.

3. The test circuit in accordance with claim 2, wherein a first control signal controls whether or not said first and second scan paths operate in a scan mode, wherein a second control signal different from said first control signal controls the operation of said selecting means, and wherein a third control signal different from said first and second control signals controls the operation of said selectors.

4. The test circuit in accordance with claim 1, wherein said first scan path includes a test data generating circuit for generating test data for said second test.

5. The test circuit in accordance with claim 1, wherein said second scan path has a data compressing function.

6. The test circuit in accordance with claim 5, wherein said second scan path constitutes an multi-input signature register circuit when said second scan path provides the output from said fourth circuit to said third circuit.

7. The test circuit in accordance with claim 6, wherein said second scan path includes:

scan flip-flops provided in corresponding relation to respective bits of the output from said second circuit, each of said scan flip-flops having a normal input for receiving the output from said second circuit, a scan input through which said scan signal is propagated, and an output;

first logic gates provided in corresponding relation to the respective bits of the output from said second circuit, each of said first logic gates having a first input for receiving a control signal, a second input for receiving one bit of the output from said second circuit, and an output for providing a value based on only said control signal when said control signal has a first logic and for providing a value on only said one bit of the output from said second circuit when said control signal has a second logic complementary to said first logic;

second logic gates provided in corresponding relation to said scan flip-flops, each of said second logic gates having a first input connected to said output of a corresponding one of said first logic gates, a second input, and an output connected to said scan input of a corresponding one of said scan flip-flops for providing an inverted/non-inverted value at its second input in accordance with the output from said corresponding first logic gate;

a third logic gate for providing an exclusive-OR of the outputs from said scan flip-flops; and a second selector for selectively providing said scan signal and the output from said third logic gate to said second input of one of said second logic gates when said control signal has said first and second logics, respectively, the second input of each of remaining ones of said second logic gates being connected to the output of one of said flip-flops which is different from said corresponding scan flip-flop.

8. The test circuit in accordance with claim 5, wherein said second scan path includes data compression circuits provided in corresponding relation to respective bits of the output from said second circuit for conducting said data compressing function, each of said data compression circuits having:

a scan flip-flop having a normal input for receiving the output from said second circuit, a scan input through which said scan signal is propagated, and an output;

a selector having an output connected to said scan input of said scan flip-flop, and first and second inputs selectively connected to said output; and a logic circuit for providing an output to said first input of said selector;

said logic circuit in each of said data compression circuits forming a loop for holding the output from said scan flip-flop therein in conjunction with said selector therein to provide a predetermined logic to said scan flip-flop when the result of said second test is defective;

said scan signal being propagated through said second inputs of said selectors.

9. The test circuit in accordance with claim 8, wherein said logic circuit in each of said data compression circuits comprises:

an exclusive-OR gate having a first input for receiving the output from said fourth circuit, a second input for receiving an expected value for the result of said second test, and an output; and an AND gate having a first input connected to the output of said exclusive-OR gate, a second input for receiving the output from a corresponding one of said scan flip-flops, and an output connected to the first input of a corresponding one of said selectors.

10. The test circuit in accordance with claim 9, wherein said logic circuit in each of said data compression circuits further comprises a NAND gate having a first input for receiving a control signal, a second input connected to the output of said exclusive-OR gate, and an output connected to said first input of said AND gate.

11. A test circuit for executing a first test from first to fifth circuits, comprising;

a first scan path for receiving an output from said first circuit and a scan-in signal to selectively provide a first output and a second output serving as a scan signal, said first output being applied to said second circuit;

selecting means for selectively providing said first output from said first scan path and an output from said second circuit to said fifth circuit; and a second scan path for selectively providing said second output from said first scan path, an output from said third circuit, and an output from said fifth circuit;

said test circuit executing a second test applied to said fifth circuit.

* * * * *